United States Patent
Ohta et al.

(10) Patent No.: US 10,229,843 B2
(45) Date of Patent: Mar. 12, 2019

(54) SUBSTRATE PROCESSING APPARATUS AND CONTROL DEVICE FOR SUBSTRATE PROCESSING APPARATUS

(71) Applicant: Tokyo Electron Limited, Tokyo (JP)

(72) Inventors: Hiroichi Ohta, Iwate (JP); Kozo Minami, Sapporo (JP)

(73) Assignee: Tokyo Electron Limited, Tokyo (JP)

( * ) Notice: Subject to any disclaimer, the term of this patent is extended or adjusted under 35 U.S.C. 154(b) by 550 days.

(21) Appl. No.: 14/439,039

(22) PCT Filed: Oct. 30, 2013

(86) PCT No.: PCT/JP2013/006438
§ 371 (c)(1),
(2) Date: Apr. 28, 2015

(87) PCT Pub. No.: WO2014/068981
PCT Pub. Date: May 8, 2014

(65) Prior Publication Data
US 2015/0294884 A1 Oct. 15, 2015

(30) Foreign Application Priority Data
Oct. 31, 2012 (JP) ................................ 2012-239972

(51) Int. Cl.
*C23C 16/52* (2006.01)
*H01L 21/67* (2006.01)
(Continued)

(52) U.S. Cl.
CPC ........ *H01L 21/67069* (2013.01); *C23C 16/52* (2013.01); *H01L 21/67109* (2013.01);
(Continued)

(58) Field of Classification Search
CPC ............... H01L 21/67069; H01L 31/18; H01L 21/67109; H01L 22/12; H01L 22/20; C23C 16/52
See application file for complete search history.

(56) References Cited

U.S. PATENT DOCUMENTS

2004/0215365 A1* 10/2004 Obara .................... C23C 16/52
700/213
2005/0222781 A1* 10/2005 Yue ...................... G05B 13/048
702/30

FOREIGN PATENT DOCUMENTS

JP 05-283308 A 10/1993
JP 2006-073845 A 3/2006
(Continued)

OTHER PUBLICATIONS

International Search Report dated Feb. 4, 2014 for WO 2014/068981 A1.

*Primary Examiner* — Yuechuan Yu
(74) *Attorney, Agent, or Firm* — Abelman, Frayne & Schwab

(57) ABSTRACT

Provided is a substrate processing apparatus including: a substrate processing unit configured to accommodate a substrate in a processing chamber, and process the substrate; and a control unit including a storage unit, a main storage unit, and a user interface unit. The control unit includes: recipe optimizing means configured to calculate a difference between measurement data obtained by measuring a processing result of the substrate and a target value, and optimize a recipe by changing some of processing conditions of the recipe so that the difference becomes smaller, and recipe batch-optimizing means configured to retrieve a batch-optimizable recipe in the storage unit in connection (Continued)

with the recipe and change some of processing conditions on the retrieved recipe like the recipe, on which the optimization is being performed.

12 Claims, 4 Drawing Sheets

(51) Int. Cl.
    *H01L 31/18*     (2006.01)
    *H01L 21/66*     (2006.01)
(52) U.S. Cl.
    CPC .............. *H01L 31/18* (2013.01); *H01L 22/12* (2013.01); *H01L 22/20* (2013.01)

(56) References Cited

FOREIGN PATENT DOCUMENTS

| | | |
|---|---|---|
| JP | 2008-091826 A | 4/2008 |
| JP | 2009-081450 A | 4/2009 |

\* cited by examiner

FIG.2

|  | BEFORE CALCULATION OF SET TEMPERATURE | AFTER CALCULATION OF SET TEMPERATURE |
|---|---|---|
| RECIPE A (FILM THICKNESS 100nm) | 681.000°C | 681.189°C |
| RECIPE B (FILM THICKNESS 105nm) | 682.000°C | 682.189°C |
| RECIPE C (FILM THICKNESS 110nm) | 683.000°C | 683.189°C |

US 10,229,843 B2

SUBSTRATE PROCESSING APPARATUS AND CONTROL DEVICE FOR SUBSTRATE PROCESSING APPARATUS

CROSS REFERENCE TO RELATED APPLICATIONS

This application is a national phase of PCT application No. PCT/JP2013/006438, filed on 30 Oct. 2013, which claims priority from Japanese patent application No. 2012-239972, filed on 31 Oct. 2012, all of which are incorporated herein by reference.

TECHNICAL FIELD

The present disclosure relates to a substrate processing apparatus and a control device for the substrate processing apparatus.

BACKGROUND

In a manufacturing process of, for example, a semiconductor, a flat panel display (FPD), or a solar cell, various substrate processing apparatuses are used to perform a batch-processing or a single processing on substrates such as, for example, semiconductor wafers, substrates for FPC, or substrates for solar cells, for example, a thermal processing apparatus, an etching apparatus, and a film-forming apparatus. In a semiconductor device manufacturing process, for example, thermal processing apparatuses are used to perform heating and processing of substrates such as semiconductor wafers, for example, processings such as formation of a CVD film and formation of a thermal oxide film. As the thermal processing apparatuses, a vertical thermal processing apparatus is known, in which the thermal processing apparatus is vertically installed and includes a cylindrical reaction tube (process tube) including an opening disposed at the bottom side and a heater disposed at the outside, and a plurality of semiconductor wafers are introduced into the cylindrical reaction tube so as to perform a batch type thermal processing. In the batch type vertical thermal processing apparatus, the semiconductor wafers are stacked and arranged to be spaced apart from each other like a shelf in a substrate holder made of, for example, quartz, and called a wafer boat, and the semiconductor wafers are introduced into the reaction tube from the opening at the bottom side.

In addition, in the vertical thermal processing apparatus, processing conditions in performing the thermal processing on, for example, semiconductor wafers are set in a plurality of recipes in advance, and a desired processing is adapted to be performed by selecting a recipe stored in a storage unit of a control device, for example. The processing conditions set in the recipes include, for example, a type of processing gas, a flow rate of the processing gas, a processing temperature, a pressure, and a processing time.

For example, in a case where a CVD film is formed or a thermal oxide film is formed in the vertical thermal processing apparatus, it is requested that the film be formed to have a thickness accurately coinciding with a target film thickness set in a recipe. Thus, a film thickness of, for example, a CVD film formed by practically executing the recipe is measured, and a process condition that reduces a difference in thickness between the film thickness and the target film thickness is calculated by an optimization calculation so as to correct and optimize the recipe (see, e.g., Patent Document 1).

However, there are multiple types of thermal processings which are performed in one thermal processing apparatus for each film type or each film thickness, for example, and the number of required recipes increases. Meanwhile, since an operation of optimizing a recipe takes a time, for example, about four hours are required for optimizing one recipe by executing the recipe, and performing, for example, a film thickness measurement and an optimization calculation, and much time is required for optimizing a plurality of recipes.

In addition, it has been proposed to define data, in which a change is possibly made, as process parameters when preparing recipes, and to call out and change the process parameters in batch when changing the recipes so that the recipes can be efficiently changed (see, e.g., Patent Document 2).

PRIOR ART DOCUMENT

Patent Document

Patent Document 1: Japanese Patent Laid-Open Publication No. 2008-091826
Patent Document 2: Japanese Patent Laid-Open Publication No. H5-283308

SUMMARY OF THE INVENTION

Problems to be Solved

As described above, the correction and optimization of recipes have been performed. However, there are a plurality of types of thermal processings to be performed in one substrate processing apparatus, for example, in a thermal processing apparatus for each film type or each film thickness, for example, and the number of required recipes increases. Meanwhile, since an operation of performing a recipe optimization takes a time, for example, about four hours are required for optimizing one recipe by executing the recipe and performing, for example, a film thickness measurement and an optimization calculation. Thus, much time is required for optimizing a plurality of recipes, which impedes improvement of productivity. In addition, even in the technique that defines data, in which a change is possibly made, as process parameters in advance, and calls out and changes the process parameters in batch when changing the recipes, it is similarly requested that the recipes be optimized one by one and much time is required for optimizing a plurality of recipes.

The present disclosure has been made in an effort to solve the problems described above and is to provide a substrate processing apparatus and a control device for the substrate processing apparatus which are capable of reducing a time required for optimizing a recipe compared to a prior art, thereby improving productivity.

Means to Solve the Problems

An aspect of a substrate processing apparatus of the present disclosure is a substrate processing apparatus including: a substrate processing unit configured to accommodate a substrate in a processing chamber, and process the substrate, and a control unit. The control unit include a storage unit configured to store a plurality of recipes that represent processing conditions, a main storage unit configured to control the substrate processing unit based on a recipe stored in the storage unit, and cause a predetermined processing to be performed on the substrate, and a user interface unit configured to access the main storage unit. The control unit includes: recipe optimizing means configured to calculate a difference between measurement data obtained by measuring a processing result of the substrate and a target value, and optimize a recipe by changing some of processing conditions of the recipe so that the difference becomes smaller, and recipe batch-optimizing means configured to retrieve a batch-optimizable recipe in the storage unit in connection with the recipe, on which an optimization is being performed by the recipe optimizing means, and change some of processing conditions on the retrieved recipe like the recipe, on which the optimization is being performed.

An aspect of a substrate processing apparatus of the present disclosure is a control device for controlling a substrate processing apparatus including a substrate processing unit that accommodates a substrate within a processing chamber and performs a processing on the substrate. The control device includes: a storage unit configured to store a plurality of recipes that represent processing conditions; a main storage unit configured to control the substrate processing unit based on a recipe stored in the storage unit, and cause a predetermined processing to be performed on the substrate; a user interface unit configured to access the main storage unit; recipe optimizing means configured to calculate a difference between measurement data obtained by measuring a processing result of the substrate and a target value, and optimize a recipe by changing some of processing conditions of the recipe so that the difference becomes smaller; and recipe batch-optimizing means configured to retrieve a batch-optimizable recipe in the storage unit in connection with the recipe, on which an optimization is being performed by the recipe optimizing means, and change some of processing conditions on the retrieved recipe like the recipe, on which the optimization is being performed.

Effect of the Invention

According to the present disclosure, it is possible to provide a substrate processing apparatus and a control device for the substrate processing apparatus which are capable of reducing a time required for optimizing a recipe compared to a prior art, thereby improving productivity.

BRIEF DESCRIPTION OF THE DRAWINGS

FIG. 2 is a view for describing an exemplary optimizing recipe.

DETAILED DESCRIPTION TO EXECUTE THE INVENTION

Hereinafter, exemplary embodiments of the present disclosure will be described with reference to the accompanying drawings.

Figure 1:
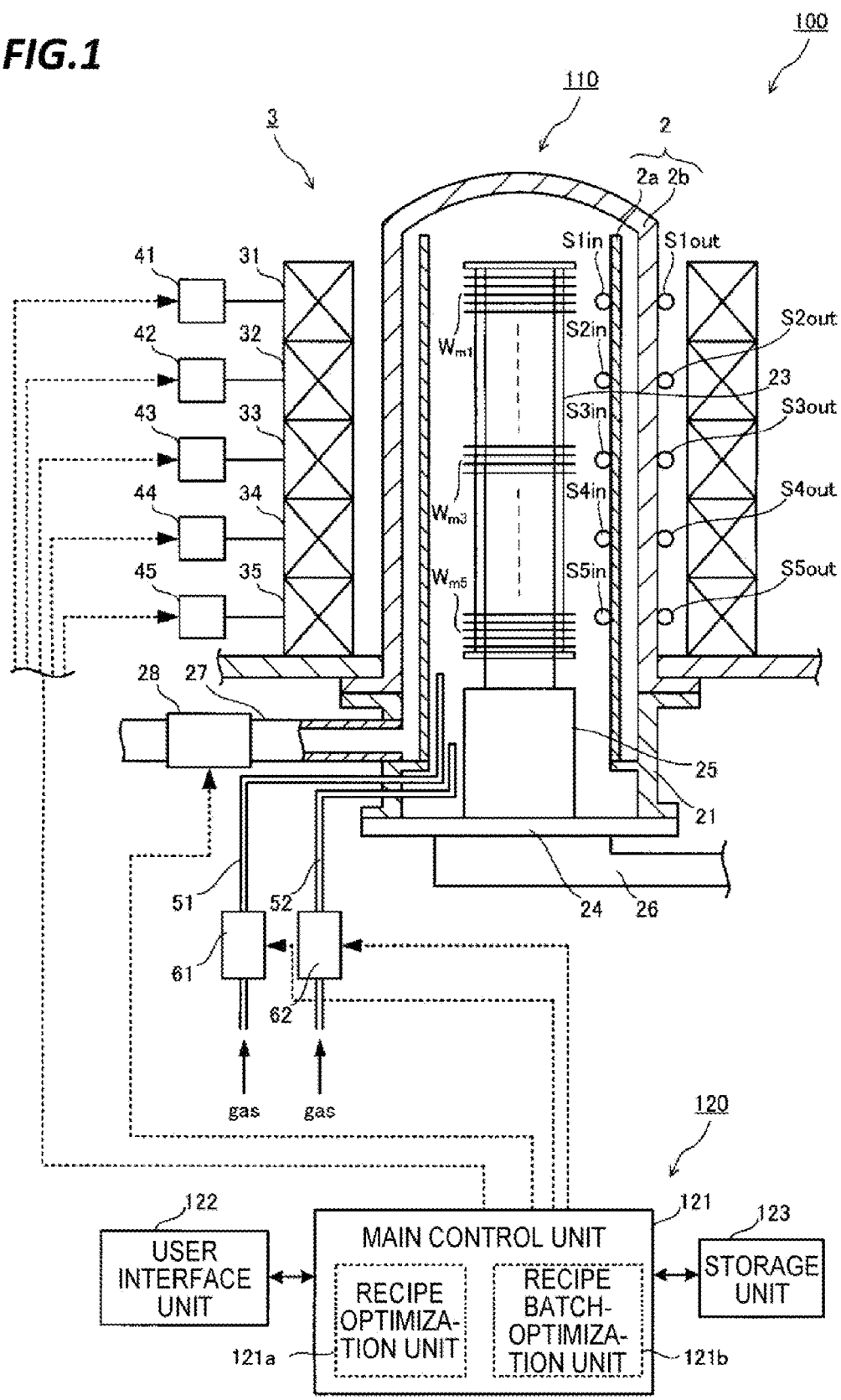
FIG. 1 is a view schematically illustrating a vertical cross-sectional configuration of a vertical thermal processing apparatus according to an exemplary embodiment of the present disclosure.

FIG. 1 is a view schematically illustrating a vertical cross-sectional configuration of a vertical thermal processing apparatus 100 according to an exemplary embodiment of the present disclosure.

As illustrated in FIG. 1, the vertical thermal processing apparatus 100 is provided with a substrate processing unit 110 configured to perform a thermal processing on substrates such as, for example, semiconductor wafers, and a control unit 120 configured to control an operation of, for example, the substrate processing unit 110.

The substrate processing unit 110 includes a reaction tube 2 with a dual tube structure which is provided with a cylindrical inner tube 2a made of, for example, quartz, and a top-closed cylindrical outer tube 2b disposed outside the inner tube 2a. A cylindrical manifold 21 made of a metal is disposed at the bottom side of the reaction tube 2. The bottom side of the manifold 21 is formed with an opening to carry, for example, semiconductor wafers into/out of the reaction tube 2, and the opening is configured to be closed by a closure 24.

The inner tube 2a is supported by an inner portion of the manifold 21 to be positioned coaxially to the outer tube 2b within the outer tube 2b. The bottom end of the outer tube 2b is hermetically bonded to the top end of the manifold 21.

Within the reaction tube 2, a wafer boat 23 serving as a substrate holder is disposed. The wafer boat 23 is made of, for example, quartz, and maintained on the closure 24 with a heat insulation tube (heat insulator) 25 being interposed therebetween. In the wafer boat 23, a plurality of semiconductor wafers (product wafers) W to be subjected to a thermal processing and a plurality (five in the present exemplary embodiment) of monitor wafers $W_{m1}$ to $W_{m5}$ (FIG. 1 only illustrates $W_{m1}$, $W_{m3}$, and $W_{m5}$) are disposed.

The closure 24 is disposed on a boat elevator 26 that moves vertically to carry the wafer boat 23 into/out of the reaction tube 2. The closure 24 is configured to be moved upward by the boat elevator 26, and upon being located at the upper limit position thereof, to close the bottom end opening of the manifold 21, i.e. the lower opening of the reaction tube which is configured by the reaction tube 2 and the manifold 21.

A heater 3 made of, for example, a heating resistor, is provided around the reaction tube 2. The heater 3 includes five heaters 31 to 35 divided along the tube axis direction of the reaction tube 2, in which the heaters 31 to 35 are configured such that the calorific values thereof may be independently controlled by power controllers 41 to 45, respectively. As described above, in the present exemplary embodiment, a heating furnace is configured by, for example, the reaction tube 2, the manifold 21, and the heater 3.

On the inner wall of the inner tube 2a, inner temperature sensors S1in to S5in made of, for example, a thermocouple, are provided to correspond to the heaters 31 to 35, respectively. In addition, outer temperature sensors S1out to S5out made of, for example, a thermocouple, are provided on the outer wall of the outer tube 2b to correspond to the heaters 31 to 35, respectively.

It may be considered that the inside of the inner tube 2a is divided into five regions (zones 1 to 5) to correspond to the heaters 31 to 35. In addition, all the semiconductor wafers W disposed in the wafer boat 23 within the reaction tube 2 form one batch and are subjected to a thermal processing in unison (batch treatment).

In the present exemplary embodiment, monitor wafers $W_{m1}$ to $W_{m5}$ are disposed in the zones 1 to 5, respectively. However, in general, the number of zones and the number of monitor wafers $W_m$ may not coincide with each other. For example, ten or three monitor wafers $W_m$ may be disposed in five zones. Even if the number of zones and the number of monitor wafers $W_m$ do not coincide with each other, a set temperature profile may be optimized.

The manifold 21 is provided with a plurality of gas supply pipes so as to supply a gas into the inner tube 2a. FIG. 1 illustrates two gas supply pipes 51 and 52 for convenience. A flow rate controller 61 or 62 such as for example, a mass flow controller, or a valve (not illustrated) is interposed in each of the gas supply pipes 51 and 52.

In addition, the manifold 21 is connected with one end of an exhaust pipe 27 so as to evacuate a clearance between the inner tube 2a and the outer tube 2b, and the other end of the exhaust pipe 27 is connected to a vacuum pump (not illustrated). In a midway of the exhaust pipe 27, a pressure control unit 28, including, for example, a butterfly valve or a valve drive unit, is provided as a mechanism for controlling the pressure within the reaction tube 2.

The control unit 120 is provided with a main storage unit 121, a user interface unit 122a, and a storage unit 123. The main storage unit 121 is configured by, for example, a computer including, for example, a central processing unit (CPU), and totally controls the operations of the substrate processing unit 110 by sending control signals to respective components of the substrate processing unit 110. In addition, the user interface unit 122 is configured by, for example, a keyboard on which an operator performs an input operation of a command, or a display that visualizes and displays an operating situation of the thermal processing apparatus 100.

The storage unit 123 is configured by, for example, a hard disc or a semiconductor memory, and stored with control programs (software) for implementing various processings implemented in the substrate processing unit 110 by a control of the main storage unit 121, and a plurality of recipes executed in the substrate processing unit 110.

The recipes are prepared in advance, for example, for each film type and each film thickness of films to be formed in which case at least a gas type, a gas flow rate, a pressure, a temperature, and a processing time are prescribed in the recipes as processing conditions. In addition, in a case where the thermal processing is performed while rotating the wafer boat 23, a rotational speed of the wafer boat 23 is also prescribed in the recipes.

In addition, in the present exemplary embodiment, the main storage unit 121 is provided with a recipe optimizing unit 121a serving as recipe optimizing means, and a recipe batch-optimizing unit 121b serving as a recipe batch-optimizing means. Details of the recipe optimizing unit 121a and the recipe batch-optimizing unit 121b will be described below. In addition, although not illustrated in FIG. 1, a film thickness measurement device is disposed in the vicinity of the vertical thermal processing apparatus 100 to measure the film thickness of, for example, CVD films formed on the monitor wafers $W_{m1}$ to $W_{m5}$, film thickness measurement data from the film thickness measurement device are adapted to be input to the recipe optimizing unit 121a of the main storage unit 121.

In addition, as necessary, when an optional recipe is called out from the storage unit 123 by, for example, an instruction from the user interface unit 122 to be executed in the main storage unit 121, a desired processing in the thermal processing apparatus 100 is performed under a control of the main storage unit 121. In addition, a control program or a recipe stored in a computer-readable storage medium (e.g., a hard disc, a CD, a flexible disc, or a semiconductor memory) may be used, or a control program or a recipe transmitted at any time from other device via, for example, a dedicated line, may also be used.

Next, descriptions will be made on a processing of semiconductor wafers W and an recipe optimization in the vertical thermal processing apparatus 100 configured as described above with reference to the drawings.

When a film forming processing is performed on the semiconductor wafer W in the vertical thermal processing apparatus 100, a recipe within the storage unit 123 is selected using, for example, the interface unit 122 to set conditions for a thermal processing to be executed in advance, as described above. In this case, for example, when a CVD film is formed, the film type and the film thickness of the CVD film to be formed are selected so that a recipe capable of forming the CVD film of the film type and the film thickness can be designated. In addition, a wafer boat 23, in which non-processed semiconductor wafers transferred from an FOUP or a cassette wafer are mounted, is carried into the reaction tube 2 by the boat elevator 26.

Thereafter, according to the set recipe, the main storage unit 121 controls the temperature by the heater 3, the pressure within the reaction tube 2, and the gas type and the gas flow rate of a gas to be supplied into the reaction tube 2 and performs a predetermined processing on the semiconductor wafers W, for example, formation of a CVD film.

In addition, when the thermal processing is finished, the temperature within the reaction tube 2 is reduced to a predetermined temperature (e.g., 300° C.) under an inert gas atmosphere, the wafer boat 23 is carried out from the inside of the reaction tube 2, and then, the processed wafers are carried out from the wafer boat 23 and returned to the FOUP or the cassette. Further, the monitor wafers $W_{m1}$ to W are carried to a film thickness measurement device (not illustrated), and the film thickness is measured at a plurality of points (e.g., nine points (one point at the center, four points in the peripheral edge, four points in the middle portion)). That is, measurement data are obtained by measuring the processed results of the substrates. In this case, when the processing is the film forming process as in the present exemplary embodiment, the film thickness measurement data are obtained as the result of film forming processing, and when the processing is the etching process, for example, etching rate data are obtained as the results of the etching process.

Figure 3:
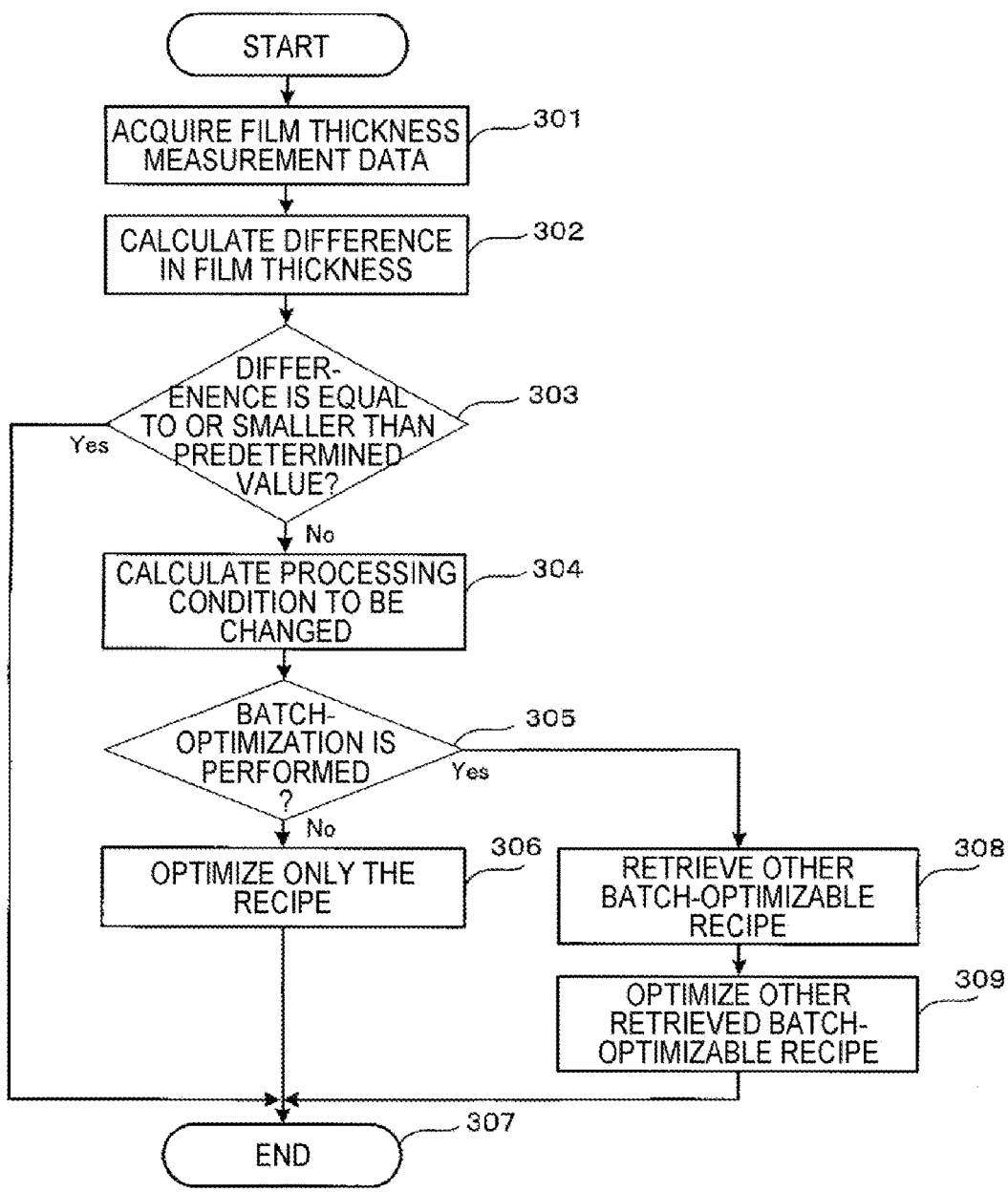
FIG. 3 is a flowchart for describing operations of the vertical thermal processing apparatus of FIG. 1.

In a case where the recipe optimization is performed, the recipe optimizing unit 121a in the main storage unit 121 is started by, for example, an instruction from the user interface unit 122 so as to perform the recipe optimization. In the recipe optimization, as illustrated in FIG. 3, first, film thickness measurement data is acquired from the film thickness measurement device (step 301).

Next, a difference between the measured film thickness value in the acquired film thickness measurement data and the target film thickness value is calculated (step 302), it is determined whether the difference is equal to or less than a predetermined value (within a permissible range) (step 303), and when the difference is equal to or less than the predetermined value (within the permissible range), the processing is finished.

Meanwhile, when the difference exceeds the predetermined value (outside the permissible range), a processing condition to be changed is calculated (step 304). For example, in a case where Recipe A illustrated in FIG. 2, in which the target film thickness is 100 nm, is executed, when the measured film thickness value is less than 100 nm and the film thickness is thin, a set temperature which enables the target film thickness value to be obtained, is calculated.

In this case, when the set temperature is raised by, for example, 1.000° C. in advance, investigation is performed as to how much the film thickness of the CVD film to be formed is changed through, for example, an actual measurement to obtain a relation between the set temperature and the film thickness so that a set temperature, which enables the target film thickness value to be obtained, may be calculated. Briefly describing, for example, in the case where there is a relationship in which when the temperature is raised by 1.000° C., the film thickness is increased by 5 nm, when the difference is −1 nm, that is, when the actually measured film thickness value is thinner than the target film thickness value by 1 nm, a set temperature of "+0.200° C. is calculated. The example illustrated in FIG. 2 is the case in which Recipe A is executed and the film thickness is thinner by 0.945 nm in which case a set temperature of "+0.189° C. is calculated, and the set temperature of Recipe A, 681.000° C., is changed to 681.189° C. so that the recipe optimization is performed.

Figure 4:
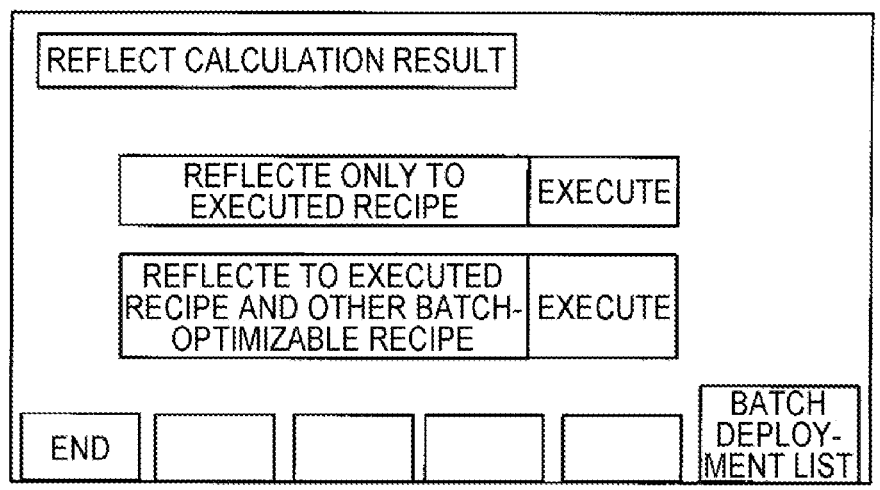
FIG. 4 is a view illustrating an example of an operation screen in a user interface unit.

Next, other optimizable recipes are retrieved and it is determined whether to perform a batch-optimization of the other batch-optimizable recipes by retrieving the other batch-optimizable recipes (step 305). In the present exemplary embodiment, the operator is able to select whether to perform the batch-optimization of the recipes every time, and, for example, as in an exemplary display screen illustrated in FIG. 4, a selection screen is displayed for selecting whether to reflect the result calculated in step 304 to the executed recipe only ("REFLECT ONLY TO EXECUTED RECIPE") or whether to reflect the result calculated in step 304 to the executed recipe and other batch-optimizable recipes ("REFLECT TO EXECUTED RECIPE AND OTHER BATCH-OPTIMIZABLE RECIPE"). In addition, on the exemplary display screen illustrated in FIG. 4, when "BATCH DEVELOPMENT LIST" is selected, the other batch-optimizable recipes is retrieved and the lists (e.g., Recipe B and Recipe C) are displayed.

In addition, when the result is reflected only to the executed recipe, only the executed recipe is changed to be optimized (step 306), and the processing is finished (step 307).

Meanwhile, in a case where a batch-optimization is performed on the other batch-optimizable recipes, the recipe batch-optimizing unit 121b is started. In addition, the other batch-optimizable recipes are retrieved (step 308), an optimization is performed by changing the other recipes which are retrieved (step 309), and the processing is finished (step 307).

The other batch-optimizable recipes may be, for examples, the recipes in which are different from each other only in the processing temperature and are equal to each other in the other processing conditions (the processing gas, the gas flow rate, the pressure, and the processing time), for example, like Recipe A, Recipe B, Recipe C illustrated in FIG. 2. That is, in the example illustrated in FIG. 2, in Recipe A, the film thickness is 100 nm and the processing temperature (set temperature) is 681.000° C., in Recipe B, the target film thickness is 105 nm and the processing temperature (set temperature) is 682.000° C., and in Recipe C, the target film thickness is 110 nm and the processing temperature (set temperature) is 683.000° C. The other processing conditions are equal to each other.

In the case where the batch-optimization described above is performed, as illustrated in FIG. 2, when Recipe A is the recipe, on which an optimization is being performed, the contents of Recipe B and Recipe C, which are the other batch-optimizable recipes, are also changed. That is, the set temperature of Recipe A is changed from 681.000° C. to 681.189° C. Likewise, the set temperature of Recipe B is changed from 682.000° C. to 682.189° C., and the set temperature of Recipe C is changed from 683.000° C. to 683.189° C.

As described above, in the present exemplary embodiment, it is possible to batch-optimize not only the recipe, on which an optimization is being performed, but also other batch-optimizable recipes. Accordingly, for example, as illustrated in FIG. 2, the three recipes of Recipe A, Recipe B, and Recipe C are capable of being optimized only with a time required for optimizing Recipe A, and thus, the recipes are capable of being optimized with a time corresponding to ⅓ of a conventionally required time.

In the above-described example, descriptions have been made with respect to the temperature of one point. However, as described above, the measurement of film thickness is performed on a plurality of (in the present exemplary embodiment, five) monitor wafers $W_{m1}$ to $W_{m5}$. Accordingly, when one recipe is optimized, the optimization is performed on five points.

When the film forming process for forming a film on semiconductor wafers with the same recipe by the vertical thermal processing apparatus 100 is successively and repeatedly performed, the film thicknesses of the films tend to be gradually changes as deterioration of a characteristic of the vertical thermal processing apparatus 100 progresses or a state within the reaction tube 2 is changed. In addition, the state of the vertical thermal processing apparatus 100 may be improved to be changed by maintenance such as, for example, component exchange. Thus, while the film forming process is successively repeated using the initially set recipe, a deviation (film thickness difference) occurs between the film thickness formed on a semiconductor wafers and the target thickness value. In such a case, a recipe optimization is performed.

For example, even when a new vertical thermal processing apparatus 100 is operated, the recipe optimization as described above is performed so as to optimize a standard recipe to be suitable for a characteristic of the apparatus.

In the foregoing, the exemplary embodiments of the present disclosure have been described with reference to the accompanying drawings, but the present disclosure is not limited thereto. It is obvious that a person skilled in the art may make various modifications or changes within the scope of spirit defined in the claims, and it is understood that the modifications or changes also belong to the technical scope of the present disclosure as a matter of course.

For example, in the exemplary embodiments described above, descriptions have been made on a case where the present disclosure is applied to a thermal processing apparatus in which semiconductor wafers are disposed and processed, but the present disclosure is not limited thereto and is applicable to various substrate processing apparatuses. For example, the present disclosure is applicable to, for example, a substrate processing apparatus that processes substrates by a single substrate processing (e.g., a single substrate type film forming apparatus or a single substrate type etching apparatus), and is also applicable to, for example, a substrate processing apparatus that processes a substrate for an flat panel display (FPD) or a substrate for a solar cell.

DESCRIPTION OF SYMBOLS

100: vertical thermal processing apparatus, 110: substrate processing unit, 120: control unit, 121: main storage unit, 122: user interface unit, 123: storage unit, 2: reaction tube, 3: heater

What is claimed is:

1. A substrate processing apparatus comprising:
   a substrate processing unit configured to accommodate a substrate in a processing chamber, and process the substrate; and
   a controller including a storage unit configured to store a plurality of recipes that represent processing conditions, a main control unit configured to control the substrate processing unit based on a first recipe stored in the storage unit, and cause a predetermined processing to be performed on the substrate, and a user interface unit configured to access the main control unit,
   wherein the controller comprises:
   a recipe optimization unit configured to calculate a difference between measurement data obtained by measuring a processing result of the substrate and a target value, and modify the first recipe by changing some of processing conditions of the first recipe so that the difference becomes smaller, and
   a recipe batch-optimization unit configured to retrieve a first set of recipes among the plurality of recipes from the storage unit based on their processing conditions, the first set of recipes being recipes that can be optimized in connection with the first recipe and change some of the processing conditions of the retrieved first set of recipes in a same manner as for the first recipe for which the optimization is being performed,
   wherein a processing condition of the first recipe before the optimization is different from a corresponding processing condition of the first set of recipes before the optimization and the other processing conditions of the first recipe before the optimization are equal to corresponding processing conditions of the first set of recipes before the optimization,
   wherein the processing conditions are described in the plurality of recipes capable of forming the target value of measurement data.

2. The substrate processing apparatus of claim 1, wherein the first recipe comprises at least a type of processing gas, a flow rate of processing gas, a processing temperature, a pressure, and a processing time, as the processing conditions.

3. The substrate processing apparatus of claim 2, wherein processing conditions of the first recipe are identical to processing conditions of the first set of recipes except the processing temperature, and the recipe batch-optimization unit changes the processing temperature of the retrieved first set of recipes.

4. The substrate processing apparatus of claim 1, wherein the substrate is any one of a semiconductor wafer, a substrate for an FPD, and a substrate for a solar cell.

5. The substrate processing apparatus of claim 1, wherein the predetermined processing is a film forming process or an etching process.

6. The substrate processing apparatus of claim 1, wherein the measurement data include any one of film thickness data in a film forming process, and etching rate data in an etching process.

7. A control device for controlling a substrate processing apparatus including a substrate processing unit that accommodates a substrate within a processing chamber and performs a processing on the substrate, the control device comprising: a storage unit configured to store a plurality of recipes that represent processing conditions;
   a main control unit configured to control the substrate processing unit based on a first recipe stored in the storage unit, and cause a predetermined processing to be performed on the substrate; and
   a user interface unit configured to access the main control unit,
   a recipe optimization unit configured to calculate a difference between measurement data obtained by measuring a processing result of the substrate and a target value, and modify the first recipe by changing some of processing conditions of the first recipe so that the difference becomes smaller; and
   a recipe batch-optimization unit configured to retrieve a first set of recipes among the plurality of recipes from the storage unit based on their processing conditions, the first set of recipes being recipes that can be optimized in connection with the first recipe and change some of the processing conditions of the retrieved first set of recipes in a same manner as for the first recipe for which the optimization is being performed,
   wherein a processing condition of the first recipe before the optimization is different from a corresponding processing condition of the first set of recipes before the optimization and the other processing conditions of the first recipe before the optimization are equal to corresponding processing conditions of the first set of recipes before the optimization,
   wherein the processing conditions are described in the plurality of recipes capable of forming the target value of measurement data.

8. The control device of claim 7, wherein the first recipe comprises at least a type of processing gas, a flow rate of processing gas, a processing temperature, a pressure, and a processing time, as the processing conditions.

9. The control device of claim 8, wherein processing conditions of the first recipe are identical to processing conditions of the first set of recipes except the processing temperature, the recipe batch-optimization unit changes the processing temperature of the retrieved first set of recipes.

10. The control device of claim 7, wherein the substrate is any one of a semiconductor wafer, a substrate for an FPD, and a substrate for a solar cell.

11. The control device of claim 7, wherein the processing is a film forming process or an etching process.

12. The control device of claim 7, wherein the measurement data include any one of film thickness data in a film forming process, and etching rate data in an etching process.

* * * * *